United States Patent [19]
Takata et al.

[11] Patent Number: 5,866,940
[45] Date of Patent: Feb. 2, 1999

[54] SEMICONDUCTOR DEVICE

[75] Inventors: Akira Takata; Tetsuo Hikawa; Takashi Sawada, all of Kobe, Japan; Tom Dang-hsing Yiu, 793 Los Positos Dr., Milpitas, Calif. 95035; Ful-Long Ni, San Jose, Calif.

[73] Assignees: Mega Chips Corporation, Suita, Japan; Tom Dang-hsing Yiu, Milpitas, Calif.

[21] Appl. No.: 897,419

[22] Filed: Jul. 21, 1997

Related U.S. Application Data

[62] Division of Ser. No. 411,982, Mar. 28, 1995, Pat. No. 5,700,975.

[30] Foreign Application Priority Data

Apr. 28, 1994 [JP] Japan .................................. 6-91991

[51] Int. Cl.⁶ .................................................. H01L 23/52
[52] U.S. Cl. .......................................... 257/691; 174/52.4
[58] Field of Search ........................ 174/52.4; 257/678, 257/684, 690, 693, 735, 691

[56] References Cited

U.S. PATENT DOCUMENTS

| | | | |
|---|---|---|---|
| 5,165,067 | 11/1992 | Wakefield et al. | 257/783 |
| 5,287,000 | 2/1994 | Takahashi et al. | 257/676 |
| 5,331,201 | 7/1994 | Nishino | 257/666 |
| 5,394,008 | 2/1995 | Ito et al. | 257/666 |
| 5,410,173 | 4/1995 | Kikushima et al. | 257/385 |
| 5,428,247 | 6/1995 | Sohn et al. | 257/368 |
| 5,442,233 | 8/1995 | Anjoh et al. | 257/666 |

Primary Examiner—Kristine Kincaid
Assistant Examiner—Hung V Ngo
Attorney, Agent, or Firm—Oblon, Spivak, McClelland, Maier & Neustadt, P.C.

[57] ABSTRACT

In order to reduce the chip size of a semiconductor device as well as to separate noises between at least two types of pads having different functions, at least one Vcc and at least one Vss are provided on opposite edges of a package (101) so that output pins or I/O pins are arranged therebetween and input pins are arranged outside the same. Non-connected excess pins (NC) are arranged on upper and lower boundaries, for omitting wires and reducing the chip size.

2 Claims, 12 Drawing Sheets

F I G. 1
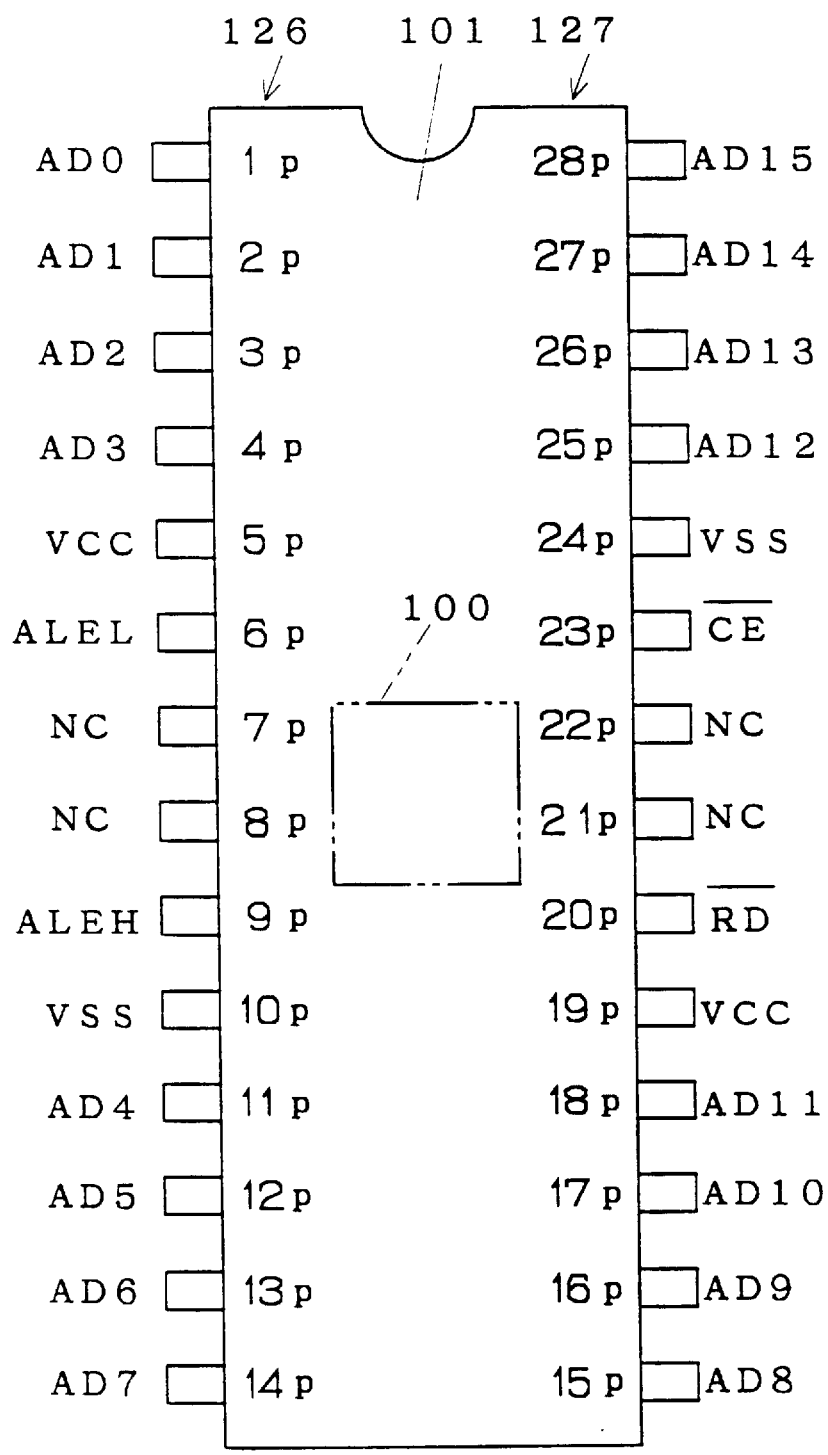

F I G. 6
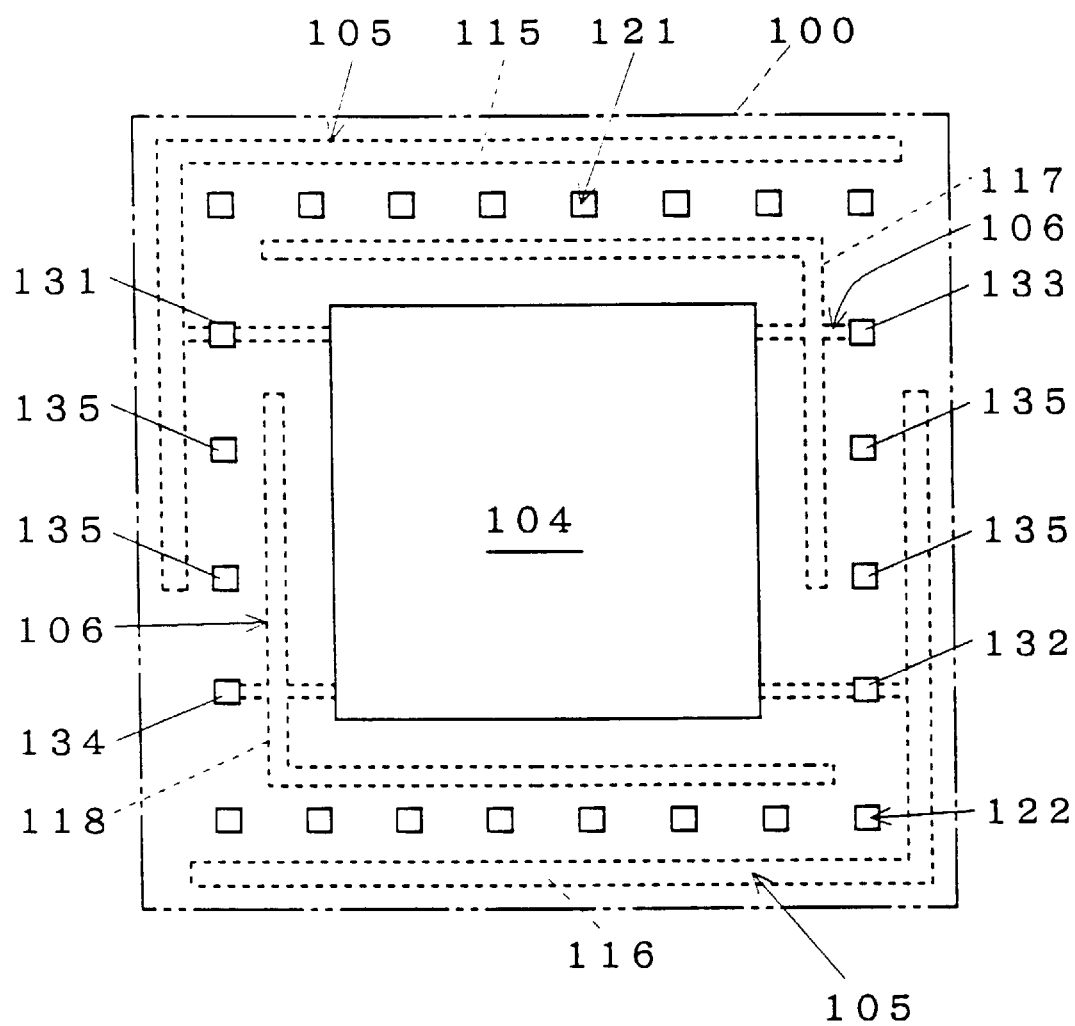

SEMICONDUCTOR DEVICE

This is a division of application Ser. No. 08/411,982, filed Mar. 28, 1995, now U.S. Pat. No. 5,700,975.

BACKGROUND OF THE INVENTION

1. Field of the Invention

The present invention relates to a semiconductor device such as a mass storage mask ROM.

2. Background of the Invention

As shown in FIG. 10, a semiconductor device is generally provided with a plurality of external connection pins 1 to 32 projecting from both side edges of a package 21 having a rectangular plane shape. In such a conventional semiconductor device, further, a power supply pin Vcc (32) and a GND terminal Vss (16) are arranged on positions which are most separate from each other on a diagonal line of the package 21, as shown in FIG. 10. In other words, the power supply pin Vcc (32) and the GND terminal Vss (16) are arranged on right upper and left lower portions of the package 21 shown in FIG. 10 respectively. Address input terminals $A_{11}$ (25) to $A_{18}$ (31) are arranged on positions relatively close to the power supply pin Vcc (32), while address input terminals $A_0$ (12) to $A_{16}$ (2) are arranged on side edge portions which are opposed to the address input terminals $A_{11}$ (25) to $A_{18}$ (31). Further, data output terminals $D_0$ (13) to $D_2$ (15) are arranged on positions relatively close to the GND terminal Vss (16), while data output terminals $D_3$ (17) to $D_7$ (21) are arranged on side edge portions which are opposed to the data output terminals $D_0$ (13) to $D_2$ (15) and the GND terminal Vss (16). Referring to FIG. 10, numeral 1 denotes a spare pin (NC), numerals 22 and 24 denote control terminals (/CE and /OE) such as chip enable terminals, and numeral 23 denotes an additional input terminal $A_{10}$. Referring to FIGS. 11 and 12, numeral 35 denotes a chip, numeral 35a denotes an internal circuit provided in the chip 35, and numeral 35b denotes a die pad for die-bonding the chip 35.

When a memory having a large data width of 8 bits or 16 bits is designed, a pad Vcc wire 31 is separated from a Vcc wire 33 for the internal circuit 35a while a pad Vss wire 32 is separated from a Vss wire 34 for the internal circuit 35a in general, in order to reduce an influence exerted by a data output noise on the chip 35. In pin arrangement of such a conventional semiconductor device, the chip 35 shown in FIG. 11 is formed in the package 21. Namely, it is necessary to wire the Vcc wire 31 and the Vss wire 32 for pads 36 and 37 provided on upper and lower portions of the chip 35 respectively, and the chip size is increased due to the wires 31 and 32 passing through left and right sides of the chip 35. While it is preferable to wire different Vcc/Vss wires for address input pads 41 and data output pads 42 in order to reduce influences exerted by output noises on input wires, the chip size is further increased if the address input pads 41 and the data output pads 42 which are arranged on the lower portion of the chip 35 are separated from each other and it is difficult to provide such a product in practice. When the chip 35 is sealed in the package 21 as shown in FIG. 12, further, a pin 45 corresponding to the central portion of the chip 35 must be arranged adjacently to a side portion of the chip 35. Thus, it is necessary to prevent bonding wires 47 and 47a for connecting the pin 45 and another pin 45a with pads 46 and 46a of the chip 35 respectively from shorting. In general, therefore, the pad 46 which is arranged adjacently to the pad 46a is displaced from the remaining pads, as shown in FIG. 12. In this case, however, only the two pads 46 and 46a provided on a corner of the chip 35 are arranged in two columns, although most of the pads are aligned with each other. In other words, an additional area is required for the corner of the chip 35, as compared with the remaining portion. When the internal circuit 35a is formed by a memory cell array, the array is incomplete if a memory cell is omitted from a part of the corner portion. Therefore, it is necessary to reduce the column or row number of X-directional or Y-directional memory cells provided in the memory cell array by several on each end. Thus, the number of the memory cells is remarkably reduced contrarily to requirement for high density.

SUMMARY OF THE INVENTION

According to a first aspect of the present invention, a semiconductor device comprises a chip and a package for storing the same, and a plurality of external connection pins which are provided on two opposite edges of the package, and the external connection pins include power supply pins which are formed on the two opposite edges of the package respectively for supplying power to the chip, ground pins which are formed on the two opposite edges of the package respectively for connecting the chip to the ground, first pins which are formed on the two opposite edges of the package respectively and employed only for inputting prescribed signals in the chip, and second pins which are formed on the two opposite edges of the package respectively and employed only for outputting at least signals from the chip, while either the second or first pins are arranged on the two opposite edges of the package respectively between the power supply pins and the ground pins, and the other pins are arranged on the two opposite edges of the package respectively outside the power supply pins and the ground pins.

According to a second aspect of the present invention, a semiconductor device comprises a chip and a package for storing the same, and a plurality of external connection pins which are provided on two opposite edges of the package, and the external connection pins include power supply pins which are formed on the two opposite edges of the package respectively for supplying power to the chip, ground pins which are formed on the two opposite edges of the package respectively for connecting the chip to the ground, and excess pins which are not connected to the exterior, while the excess pins are arranged between the power supply pins and the ground pins on the two opposite edges of the package respectively.

According to a third aspect of the present invention, a semiconductor device comprises a chip and a package for storing the same, and a plurality of external connection pins which are provided on two opposite edges of the package, and the external connection pins include power supply pins which are formed on the two opposite edges of the package at least one by one respectively for supplying power to the chip, and ground pins which are formed on the two opposite edges of the package at least one by one respectively for connecting the chip to the ground, while power supply pads for connection to the power supply pins and ground connection pads for connection to the ground pins are provided on two opposite edges of the chip respectively.

According to a fourth aspect of the present invention, a semiconductor device comprises a chip and a package for storing the same, and a plurality of external connection pins, including power supply and ground pins, which are provided on two opposite edges of the package, and the chip includes an internal circuit having at least single power supply terminals and at least single ground connection terminals on two opposite edges respectively, a first pad portion for connecting the internal circuit with the power supply pins, and a second pad portion for connecting the internal circuit with the ground pins, while the first pad portion comprises power supply pads which are formed on the two opposite edges of the chip at least one by one to be wired between the power supply terminals of the internal circuit and the power supply pins, and pad power supply wires which are arranged in parallel with each other in the vicinity of two opposite edges of the internal circuit to be connected to the power supply pads respectively, and the second pad portion comprises ground connection pads which are formed on the two opposite edges of the chip at least one by one to be wired between the ground connection terminals of the internal circuit and the ground pins, and pad ground wires which are arranged in parallel with each other in the vicinity of the two opposite edges of the internal circuit to be connected to the ground connection pads respectively.

According to the third or fourth aspect of the present invention, the first power supply pin is preferably arranged on either side edge of the package and the second power supply pin is preferably arranged on another side edge of the package among the external connection pins, while the first ground pin is preferably arranged on either side edge of the package and the second ground pin is preferably arranged on another side edge of the package among the external connection pins.

According to the third or fourth aspect of the present invention, the chip is preferably provided at least one side thereof with a first pad which is employed only for inputting a prescribed signal in the chip, and a second pad which is employed for outputting at least a signal from the chip, the power supply pad and the ground connection pad arranged on at least one side of the chip which is provided with the second and first pads are preferably separated from each other at a prescribed distance, one of the second and first pads is preferably arranged between the power supply pad and the ground connection pad, and the other one of the second and first pads is preferably arranged on an end portion which is separated from the pad through the power supply pad or the ground connection pad.

According to the third or fourth aspect of the present invention, the first power supply terminal which is formed on one edge of the internal circuit and the first ground connection terminal which is formed on another edge are preferably opposed to each other, and the second power supply terminal which is formed on the other edge of the internal circuit and the second ground connection terminal which is formed on the edge are preferably opposed to each other.

According to the third or fourth aspect of the present invention, the external connection pins preferably include excess pins which are not connected to the exterior, and the excess pins are preferably arranged between the power supply pins and the ground pins on the two opposite edges of the package respectively.

According to the first aspect of the present invention, either the second or first pins are arranged through the power supply pins or the ground connection pins whereby it is possible to separate the pins from each other through the power supply pins or the ground connection pins even if noises are introduced to either pins.

According to the third aspect of the present invention, the power supply pins and the ground pins are arranged on the two opposite edges of the package at least one by one respectively while the power supply pads and the ground connection pads are provided on the two opposite edges of the chip respectively, whereby it is not necessary to wire the two opposite edges of the chip in the interior and the exterior thereof. Thus, it is possible to improve area efficiency of the chip.

In the semiconductor device according to the fourth aspect of the present invention, the pad power supply wires and the pad ground wires must be wire-bonded to respective lead frames from the two opposite edges of the internal circuit while it is not necessary to pass these wires through the two edges due to the power supply terminals and the ground connection terminals which are arranged on the two opposite edges of the internal circuit. Namely, it is possible to connect the pad power supply wires and the pad ground wires to the external connection pins from the two opposite edges of the internal circuit without spreading these wires all over the periphery of the internal circuit. Thus, it is possible to reduce the chip size.

In the semiconductor device according to the third or fourth aspect of the present invention, the power supply pins are arranged on both side edges of the package respectively while the ground pins are also arranged on both side edges of the package respectively, whereby it is possible to draw out all of the power supply pins and the ground pins from the both side edges of the package. When the structure according to the fourth aspect of the present invention is employed, therefore, it is possible to readily wire the power supply pads, the power supply pins, the ground pads and the ground pins thereby improving the degree of freedom in wiring design.

In the semiconductor device according to the third or fourth aspect of the present invention, the first and second pads are arranged through the power supply pads or the ground connection pads, whereby it is possible to separate either pad from the other pad by the power supply pad or the ground connection pad even if noises are introduced into the former pad.

In the semiconductor device according to the third or fourth aspect of the present invention, at least two power supply terminals are arranged on opposite sides of a diagonal line of the internal circuit while at least two ground connection terminals are arranged on opposite sides of another diagonal line of the internal circuit, whereby the degree of freedom in design is improved as to wiring of both of the internal circuit and the exterior of the chip.

In the semiconductor device according to the second, third or fourth aspect of the present invention, the excess pins are arranged on positions between the power supply pins and the ground pins on the side edges of the package. Thus, it is not necessary to wire the chip and the excess pins when the chip is arranged on a position corresponding to the said position, whereby it is not necessary to form a plurality of columns of pads on corner portions of the chip for preventing the bonding wires from shorting, dissimilarly to the prior art. Thus, it is possible to form a complete square array etc. up to end portions of the chip, thereby improving area efficiency as compared with the prior art.

Accordingly, an object of the present invention is to provide a semiconductor device which can be reduced in size, separate noises between at least two different types of pads, and simplify wire bonding.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a semiconductor device according to a first embodiment present invention;

FIG. 6 is a wiring layout diagram showing a periphery of an internal circuit of a semiconductor device according to a second embodiment of the present invention;

DESCRIPTION OF THE PREFERRED EMBODIMENTS

[First Embodiment]

<Structure>

FIG. 1 illustrates a semiconductor device according to a first embodiment of the present invention. As shown in FIG. 1, the semiconductor device according to this embodiment is a mass storage semiconductor memory device which is formed by sealing a 64-megabit mask ROM in a package having 28 pins, and comprises a package 101 and a chip 100 which is contained in the package 101.

Figure 5:
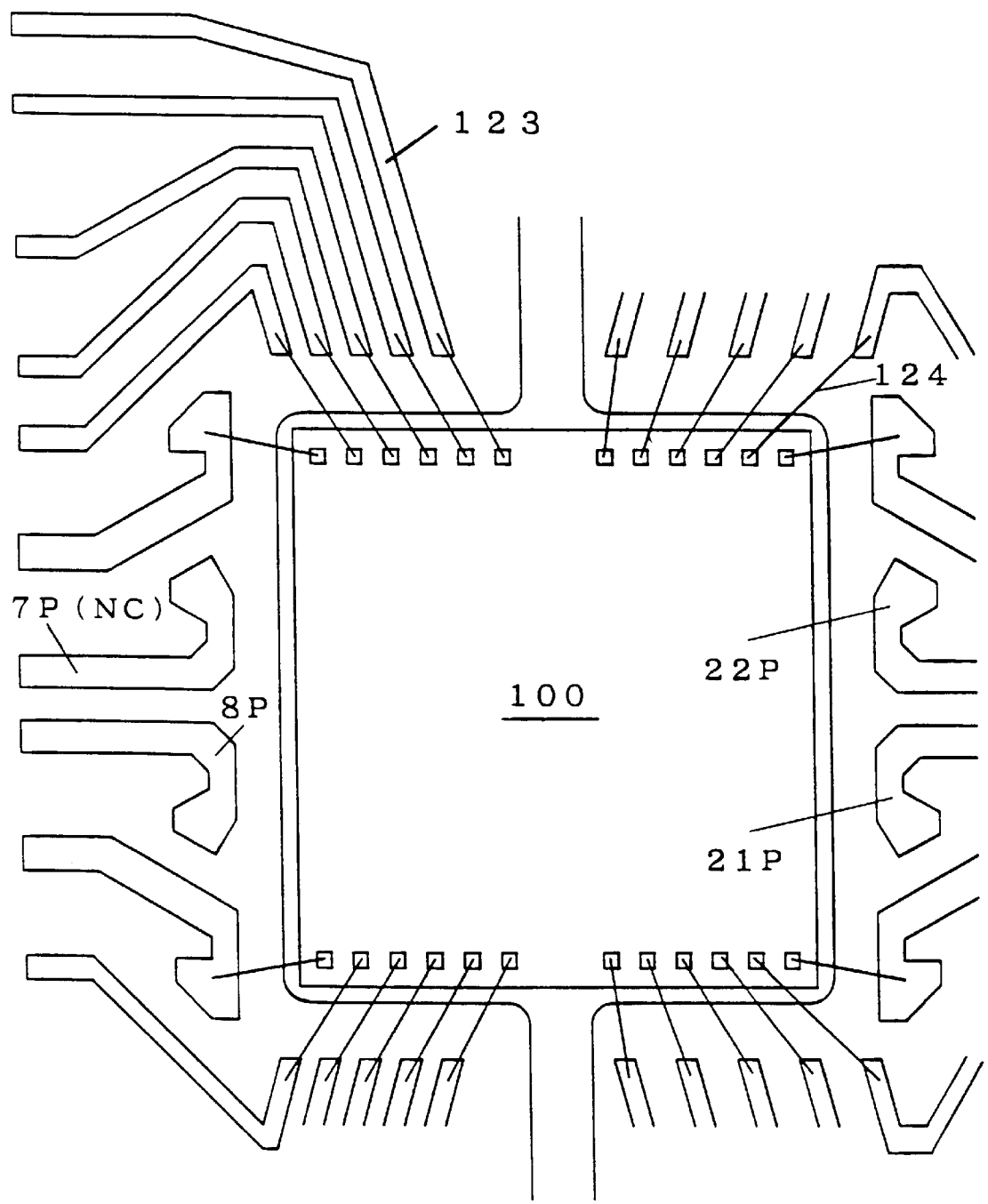
FIG. 5 is a plan view showing the internal circuit and lead frames of the semiconductor device according to the first embodiment of the present invention.

The package 101 comprises an insulating substrate and a molding which is made of epoxy resin or the like for sealing circuits etc. provided on the insulating substrate, so that an internal circuit 104 is inserted therebetween. A plurality of (28) external connection pins 1P to 28P including power supply pins (Vcc) 5P and 19P and ground pins (Vss) 10P and 24P are formed on opposite edges (left and right edges in FIG. 1) of the package 101, while a plurality of lead frames 123 are formed between the external connection pins 1P to 28P and the chip 100 for connecting the former and the latter with each other by bonding wires, as shown in FIG. 5.

The external connection pins 1P to 28P are arranged on opposite edges 126 and 127 (left and right edges in FIG. 1) in the peripheral portions of the package 101. Among these external connection pins 1P to 28P, the power supply pins (Vcc) 5P and 19P and the ground pins (Vss) 10P and 24P are arranged on substantially central portions of the edges 126 and 127 (left and right edges in FIG. 1) of the package 101. Among these, the first power supply pin (Vcc) 5P is arranged on a substantially central portion of one edge of the package 101, while the second power supply pin (Vcc) 19P is arranged on a substantially central portion of the other edge of the package 101. Further, the first ground pin (Vss) 10P is arranged on a substantially central portion of one edge of the package 101, while the second ground pin (Vss) 24P is arranged on a substantially central portion of the other edge of the package 101. Among the external connection pins 1P to 28P, further, I/O pins (second pins) 1P to 4P, 11P to 14P, 15P to 18P and 25P to 28P serving both as address input pins and data output pins are arranged on positions upward and downward beyond the power supply pins (Vcc) 5P and 19P and the ground pins (Vss) 10P and 24P on the left and right edges 126 and 127 of the package 101.

The external connection pins 1P to 28P include excess pins (NC) 7P, 8P, 21P and 22P, a chip enable pin (/CE) 20P, a read pin (/RD) 23P, an ALEL pin 6P and an ALEH pin 9P, which are formed on the left and right edges 126 and 127 of the package 101 and not connected to the exterior. The chip enable pin (/CE) 20P, the read pin (/RD) 23P, the ALEL pin 6P and the ALEH pin 9P are generically called input pins (first pins) which are employed only for inputting control signals. The excess pins (NC) 7P and 8P, the ALEL pin 6P and the ALEH pin 9P are arranged between the power supply pin (Vcc) 5P and the ground pin (Vss) 10P on the left edge 126. On the other hand, the excess pins (NC) 21P and 22P, the chip enable pin (/CE) 20P and the read pin (/RD) 23P are arranged between the power supply pin (Vcc) 19P and the ground pin (Vss) 24P on the right edge 127.

Figure 2:
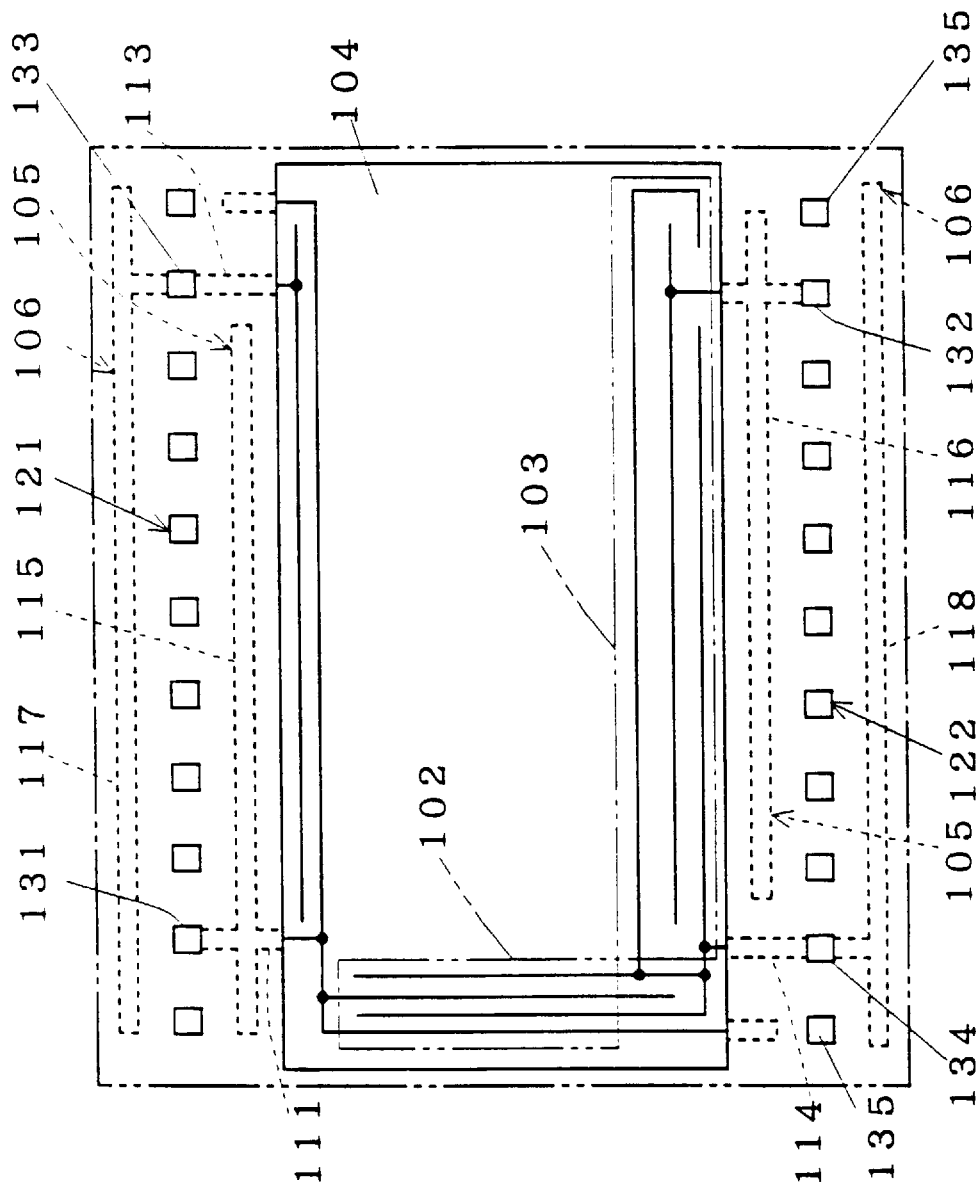
FIG. 2 is a wiring layout diagram showing a periphery of an internal circuit of the semiconductor device according to the first embodiment of the present invention.

As shown in FIG. 2, the chip 100 comprises the internal circuit 104 serving as a storage circuit, and first and second pad portions 105 and 106 for connecting (wire-bonding) the internal circuit 104 with the external connection pins 1P to 28P through the lead frames 123 respectively.

The internal circuit 104 comprises a memory cell array which is formed by a number of vertically and transversely arranged memory cells, and peripheral circuits (102 and 103) for controlling the same. In the memory cell array of the internal circuit 104, the respective memory cells are regularly arranged in transverse symmetry. An X (word line selection) decoder 102 is arranged on a left end portion of the internal circuit 104 as a peripheral circuit for specifying word lines for the memory cells along the vertical direction (Y direction), while a Y (bit line selection) decoder 103 is arranged on a lower end portion of the internal circuit 104 as a peripheral circuit for specifying bit lines for the memory cells along the transverse direction (X direction).

The first pad portion 105 comprises a pair of power supply (Vcc) pads 131 and 132 which are connected (wire-bonded) to the lead frames 123 which are connected to the power supply pins (Vcc) 5P and 19P, and pad power supply wires 115 and 116 which are connected between the power supply pads 131 and 132 and the internal circuit 104 to be arranged in parallel with each other in the vicinity of two opposite edges (upper and lower edges) of the internal circuit 104 shown in FIG. 2 with lengths identical to those of the edges.

Among these, the first power supply pad 131 and the pad power supply wire 115 corresponding thereto are arranged on one side of the chip 100 in the vicinity of its upper edge in FIG. 2, while the second power supply pad 132 and the pad power supply wire 116 corresponding thereto are arranged on another side of the chip 100 in the vicinity of its lower edge in FIG. 2. Further, the first power supply pad 131 is arranged on a position slightly rightward from the left end portion of the upper edge of the chip 100 in FIG. 2, while the second power supply pad 132 is arranged on a position slightly leftward from the right end portion of the lower edge of the chip 100 in FIG. 2. Thus, it is possible to rotation-symmetrically arrange the power supply pads 131 and 132 about the central portion of the internal circuit 104.

The pad power supply wires 115 and 116 are substantially straight metal wires of aluminum or the like which are arranged downward beyond a protective film forming the uppermost surface of the chip 100, and connected to P-channel MOS transistors (Qp) (see FIGS. 3 and 4) corresponding to the power supply pads 131 and 132 respectively as described later, as well as to the X decoder 102 and the Y decoder 103 through power supply terminals 111 and 112 of the internal circuit 104.

The second pad portion 106 comprises a pair of ground (Vss) connection pads 133 and 134 which are connected (wire-bonded) to the lead frames 123 being connected to the ground pins (Vss) 10P and 24P, and pad ground wires 117 and 118 which are arranged between the ground connection pads 133 and 134 and the internal circuit 104 in parallel with each other in the vicinity of two opposite edges, i.e., upper and lower edges of the internal circuit 104 in FIG. 2, with lengths identical to those of the edges.

Among these, the first ground connection pad 133 and the pad ground wire 117 corresponding thereto are arranged on one side of the chip 100 in the vicinity of its upper edge in FIG. 2, while the second ground connection pad 134 and the pad ground wire 118 corresponding thereto are arranged on the other side of the chip 100 in the vicinity of its lower edge in FIG. 2.

The first ground connection pad 133 is arranged on a position slightly leftward from the right end portion of the upper edge of the chip 100 in FIG. 2, while the second ground connection pad 134 is arranged on a position slightly rightward from the left end portion of the lower edge of the chip 100 in FIG. 2. Thus, it is possible to rotation-symmetrically arrange the ground connection pads 133 and 134 about the central portion of the internal circuit 104.

The pad ground wires 117 and 118 are substantially straight metal wires of aluminum or the like which are arranged downward beyond the protective film forming the uppermost surface of the chip 100, and connected to N-channel MOS transistors (Qn) (see FIGS. 3 and 4) corresponding to the ground connection pads 133 and 134 respectively as described later, as well as to the X decoder 102 and the Y decoder 103 through ground connection terminals 113 and 114 of the internal circuit 104.

Figure 3:
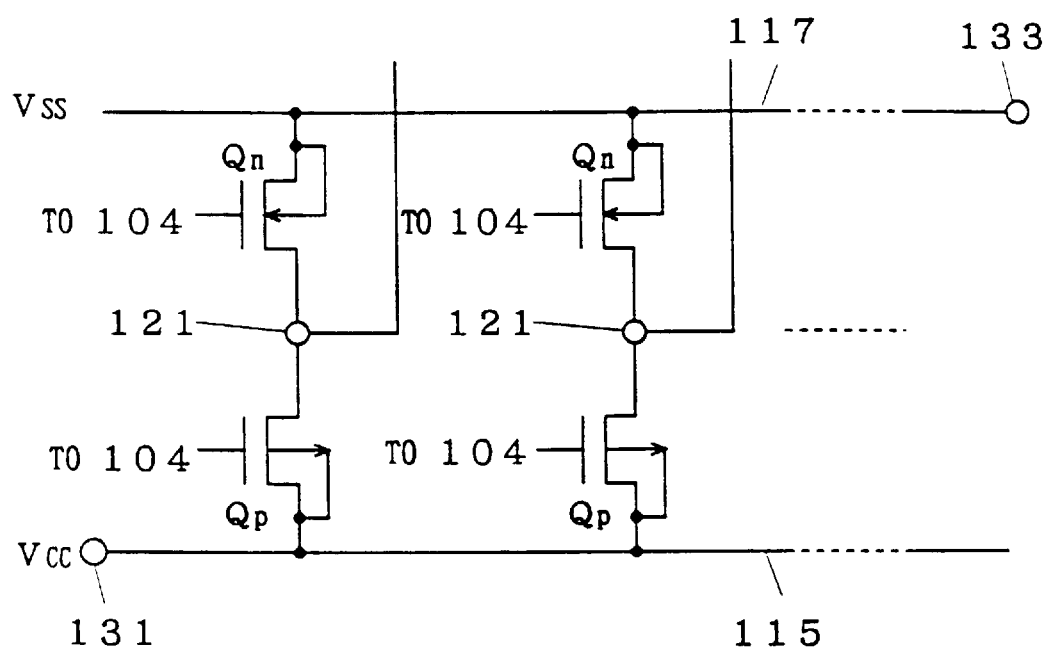
FIG. 3 is a circuit diagram showing a state of connection between respective pads provided on one side of the semiconductor device according to the first embodiment of the present invention.
Figure 4:
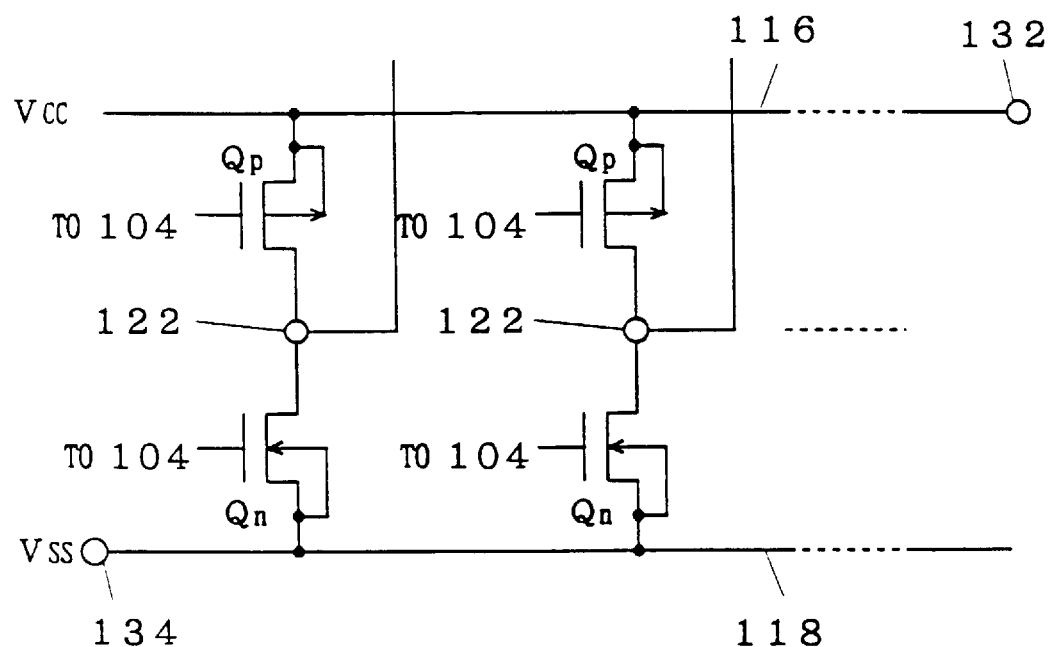
FIG. 4 is a circuit diagram showing a state of connection between respective pads provided on another side of the semiconductor device according to the first embodiment the present invention.

The power supply pad 131 and the ground connection (Vss) pad 133 which are arranged on the first side, i.e., the upper edge of the internal circuit 104 in FIG. 2, are separated from each other at a prescribed distance, so that output pads (second pads) 121 of the internal circuit 104 are formed between the power supply pad 131 and the ground connection (Vss) pad 133. Further, the power supply pad 132 and the ground connection (Vss) pad 134 which are arranged on the second side, i.e., the lower edge of the internal circuit 104 in FIG. 2, are separated from each other at a prescribed distance, so that a plurality of output pads (second pads) 122 are formed between the power supply pad 132 and the ground connection (Vss) pad 134. The output pads 121 and 122, which receive head addresses in an initial access to the memory cell array of the chip 100, are employed as dual purpose pads (hereinafter referred to as I/O pads) serving both as address input and data output pads. Each of the I/O pads 121 and 122 is connected to a junction between a source and a drain of a P-channel MOS transistor (Qp) or an N-channel MOS transistor (Qn), as shown in FIG. 3 or 4. The pad power supply wires 115 and 116 are connected to the respective P-channel MOS transistors (Qp), while the pad ground wires 117 and 118 are connected to the respective N-channel MOS transistors (Qn) respectively. As shown in FIG. 5, the I/O pads 121 and 122 are wire-bonded to corresponding ones of the lead frames 123 by bonding wires 124 respectively, to be electrically connected to corresponding ones of the external connection pins (I/O pins) 1P to 4P, 11P to 14P, 15P to 18P and 25P to 28P respectively.

The power supply pad 131 which is formed on the first side (upper edge in FIG. 2) of the internal circuit 104 and the ground connection (Vss) pad 134 which is formed on the second side (lower edge in FIG. 2) are opposed to each other through the internal circuit 104. On the other hand, the power supply pad 132 which is formed on the second side (lower edge in FIG. 2) of the internal circuit 104 and the ground connection (Vss) pad 133 which is formed on the first side (upper edge in FIG. 2) are opposed to each other through the internal circuit 104. Thus, it is possible to rotation-symmetrically arrange/shape the first and second pad portions 105 and 106 about the central portion of the internal circuit 104.

Referring to FIG. 2, numeral 135 denotes input pads (first pads) for inputting a /CE signal, a /RD signal, an ALEL signal and an ALEH signal from the chip enable pin (/CE) 20P, the read pin (/RD) 23P, the ALEL pin 6P and the ALEH pin 9P in the internal circuit 104 respectively. The input pads 135 are arranged on left and right end portions which are separated from the I/O pads 121 and 122 through the power supply pads 131 and 132 and the ground connection (Vss) pads 133 and 134.

<Method of Employment>

In employment of the semiconductor device having the aforementioned structure, an external power source is connected to the power supply pins (Vcc) 5P and 19P for supplying power to the X decoder 102 and the Y decoder 103 of the internal circuit 104 through the lead frames 123, the bonding wires 124, the power supply pads 131 and 132 and the pad power supply wires 115 and 116, while supplying power to the P-channel MOS transistors (Qp) of the I/O pads 121 and 122 etc. Addressing is made in an initial time through the I/O pins 1P to 4P, 11P to 14P, 15P to 18P and 25P to 28P to access desired memory cells, and thereafter data of the accessed memory cells are outputted through the I/O pins 1P to 4P, 11P to 14P, 15P to 18P and 25P to 28P. In subsequent addressing, address incrementation is carried out in the interior of the chip 100, thereby automatically carrying out address shifting. Currents used in the N-channel MOS transistors (Qn) of the internal circuit 104, the ground connection pads 133 and 134 and the like are discharged to the exterior from the ground pins (Vss) 10P and 24P through the pad ground wires 117 and 118, the ground connection (Vss) pads 133 and 134, the bonding wires 124 and the lead frames 123.

While the pad power supply wires 115 and 116 and the pad ground wires 117 and 118 must be wire-bonded to the respective lead frames 123 from two opposite edges of the internal circuit 104 in this case, it is not necessary to pass these wires 115 to 118 through the two edges dissimilarly to the prior art, since the power supply terminals 111 and 112 and the ground connection terminals 113 and 114 of the internal circuit 104 are arranged on two opposite edges (upper and lower edges) of the internal circuit 104. In other words, it is possible to connect the pad power supply wires 115 and 116 and the pad ground wires 117 and 118 to the external connection pins without spreading these wires 115 to 118 all over the periphery of the internal circuit 104. Thus, it is possible to reduce the chip size. When the pad power supply wires 115 and 116 and the pad ground wires 117 and 118 are increased in width for maintaining wiring resistances (impedances) thereof at low levels, in particular, considerable spaces are required on the side edges of the chip 100 as in a second embodiment (see FIG. 6) described later. In the structure of this embodiment shown in FIG. 5, however, it is possible to omit the pad power supply wires 115 and 116 and the pad ground wires 117 and 118 between the left and right edges of the internal circuit 104 and those of the chip 100, thereby reducing considerable spaces.

Since the first power supply pin (Vcc) 5P is arranged on either side edge of the package 101 and the second power supply pin (Vcc) 19P is arranged on the other side edge of the package 101 while the first ground pin (Vss) 10P is arranged on either side edge of the package 101 and the second ground pin (Vss) 24P is arranged on the other side edge of the package 101, it is possible to draw out all of the power supply pins Vcc and the ground pins Vcc from both side edges of the package 101 for freely drawing out the circuit, thereby improving the degree of freedom in wiring design.

When the I/O pads 121 and 122 are connected as shown in FIGS. 3 and 4, currents are remarkably changed in switching of the P-channel MOS transistors (Qp) and the N-channel MOS transistors (Qn), which in turn generate noises in response. When such noises are introduced into the input pads 135, the semiconductor memory device may cause a malfunction. According to this embodiment, however, the input pads 135 are separated from the I/O pads 121 and 122 through the power supply pads 131 and 132 and the ground connection (Vss) pads 133 and 134. Even if noises are generated in the I/O pads 121 and 122, therefore, it is possible to separate the input pads 135 from the noises by the power supply pads 131 and 132 or the ground connection (Vss) pads 133 and 134, thereby preventing bad influences caused by the noises as well as a malfunction of the semiconductor memory device.

Further, the power supply terminals 111 and 112 and the ground connection terminals 113 and 114 are rotation-symmetrically arranged about the center of the internal circuit 104 while corresponding ones of these terminals 111 to 114 are opposed to each other, whereby power supply or ground connection may he performed from any terminal for supplying power to a peripheral circuit such as a sense circuit, for example, regardless of arrangement of the peripheral circuit. Thus, the degree of freedom in circuit design is remarkably improved and it is possible to improve area efficiency by reducing lengths of wires etc. therebetween.

In addition, the excess pins (NC) 7P, 8P, 21P and 22P are arranged on the positions between the power supply pins Vcc and the ground pins Vss along the edges 126 and 127 of the package 101, whereby it is not necessary to wire the chip 100 and the excess pins (NC) 7P, 8P, 21P and 22P if the chip 100 is so arranged to correspond to these positions. Thus, it is not necessary to form a plurality of columns of pads on each corner portion of the chip 100 for preventing the bonding wires from shorting, dissimilarly to the prior art. Therefore, it is possible to form a complete square array and peripheral circuits (the X decoder 102 and the Y decoder 103) thereof up to end portions of the chip 100, thereby improving area efficiency as compared with the prior art.

[Second Embodiment]

<Structure>

FIG. 6 illustrates a semiconductor device according to a second embodiment of the present invention. In the semiconductor device according to this embodiment, pads which are in a large number as compared with dimensions of an internal circuit 104 are arranged on four sides of the internal circuit 104. The remaining structure is similar to that of the first embodiment, particularly in a point that I/O pads 121 and 122 and input pads 135 are electrically separated from each other through power supply pads 131 and 132. Members/elements having the same functions as those in the first embodiment are denoted by the same reference numerals. According to this embodiment, chip size reduction is restricted due to pad power supply wires 115 and 116 and pad ground wires 117 and 118 which are arranged on left and right sides of the internal circuit 104, while it is possible to separate noises which may be introduced into the I/O pads 121 and 122 from the input pads 135 by the power supply pads 131 and 132 or the ground connection (Vss) pads 133 and 134, similarly to the first embodiment. Thus, it is possible to reduce influences exerted on the input pads 135 by noises introduced into the I/O pads 121 and 122.

[Third Embodiment]

<Structure>

Figure 7:
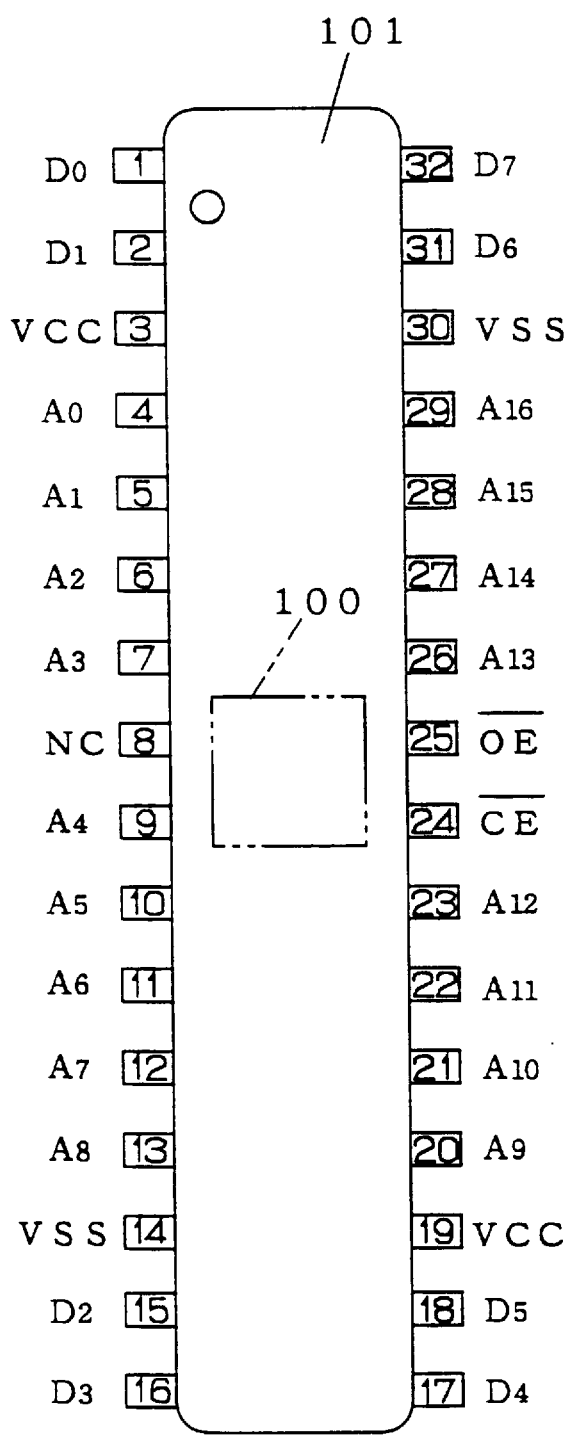
FIG. 7 is a plan view showing a semiconductor device according to a third embodiment of the present invention.

FIG. 7 illustrates a semiconductor device according to a third embodiment of the present invention. The semiconductor device according to this embodiment, which is a 4-megabit conventional mask ROM, has no I/O pins (serving both as address input and data output pins) described with reference to the first embodiment etc., but makes data output from prescribed output pins D0 to D7. Referring to FIG. 7, symbol Vcc denotes power supply pins which are similar to those described with reference to the first and second embodiments, symbol Vss denotes ground pins, symbols A0 to A16 denote address input pins, symbol NC denotes an excess pin, and symbols /CE and /RD denote control signal input pins. It is possible to attain effects similar to those of the aforementioned embodiments by employing a similar internal structure, as a matter of course.

[Fourth Embodiment]

<Structure>

Figure 8:
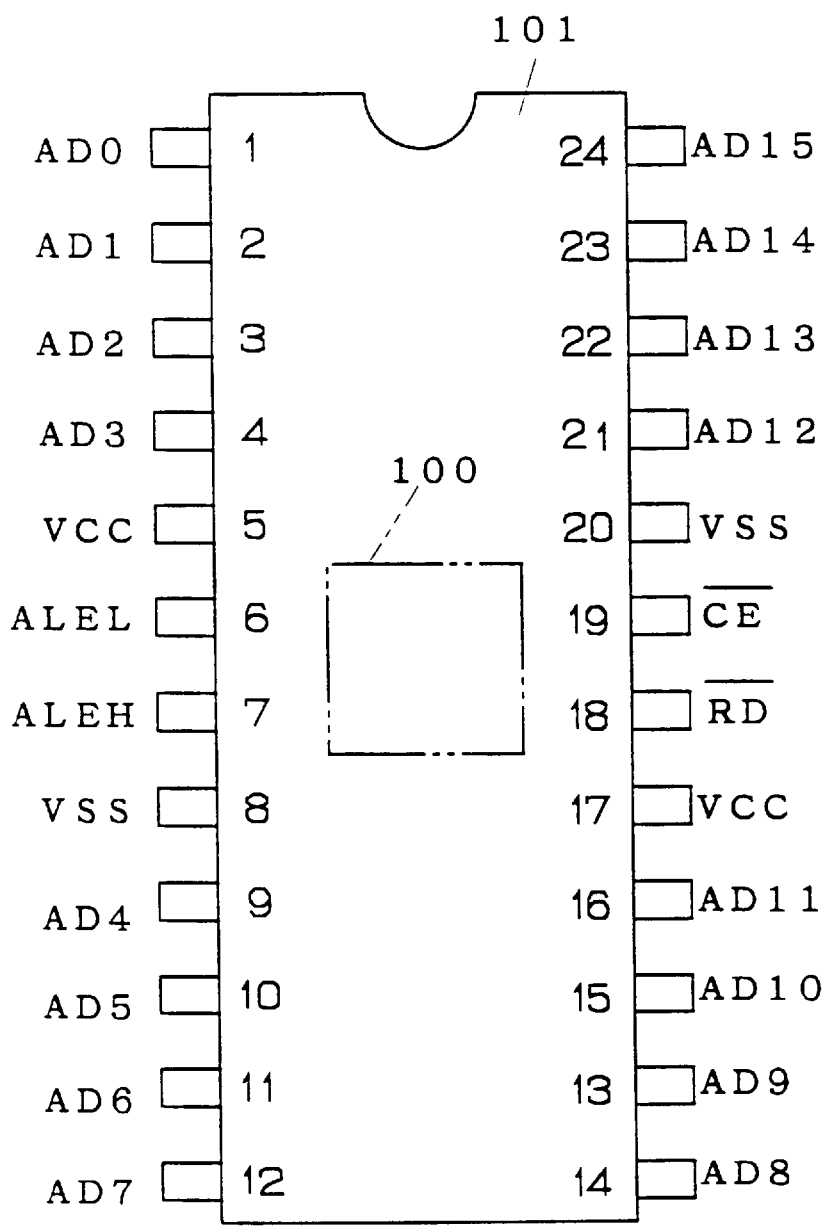
FIG. 8 is a plan view showing a semiconductor device according to a fourth embodiment of the present invention.

FIG. 8 illustrates a semiconductor device according to a fourth embodiment of the present invention. The semiconductor device according to this embodiment includes no excess pin (NC) which is not connected to the exterior among external connection pins 1P to 24P. Thus, it is necessary to wire-bond all external connection pins 1P to 24P and hence pads which are connected to ALEH, ALEL, /CE and /RD pins are arranged in two columns similarly to the second embodiment shown in FIG. 6 when central portions of both side edges of a package 101 are approached to side edges of the internal circuit 104, to deteriorate area efficiency in array structure. Except this point, however, it is possible to attain effects similar to those of the first embodiment.

[Modifications]

(1) While only single ones of the power supply pads 131 and 132 and the ground connection (Vss) pads 133 and 134 are arranged on the two opposite edges (upper and lower edges in FIG. 2) of the internal circuit 104 in the first embodiment, plural pads may alternatively be provided on each edge.

Figure 9:
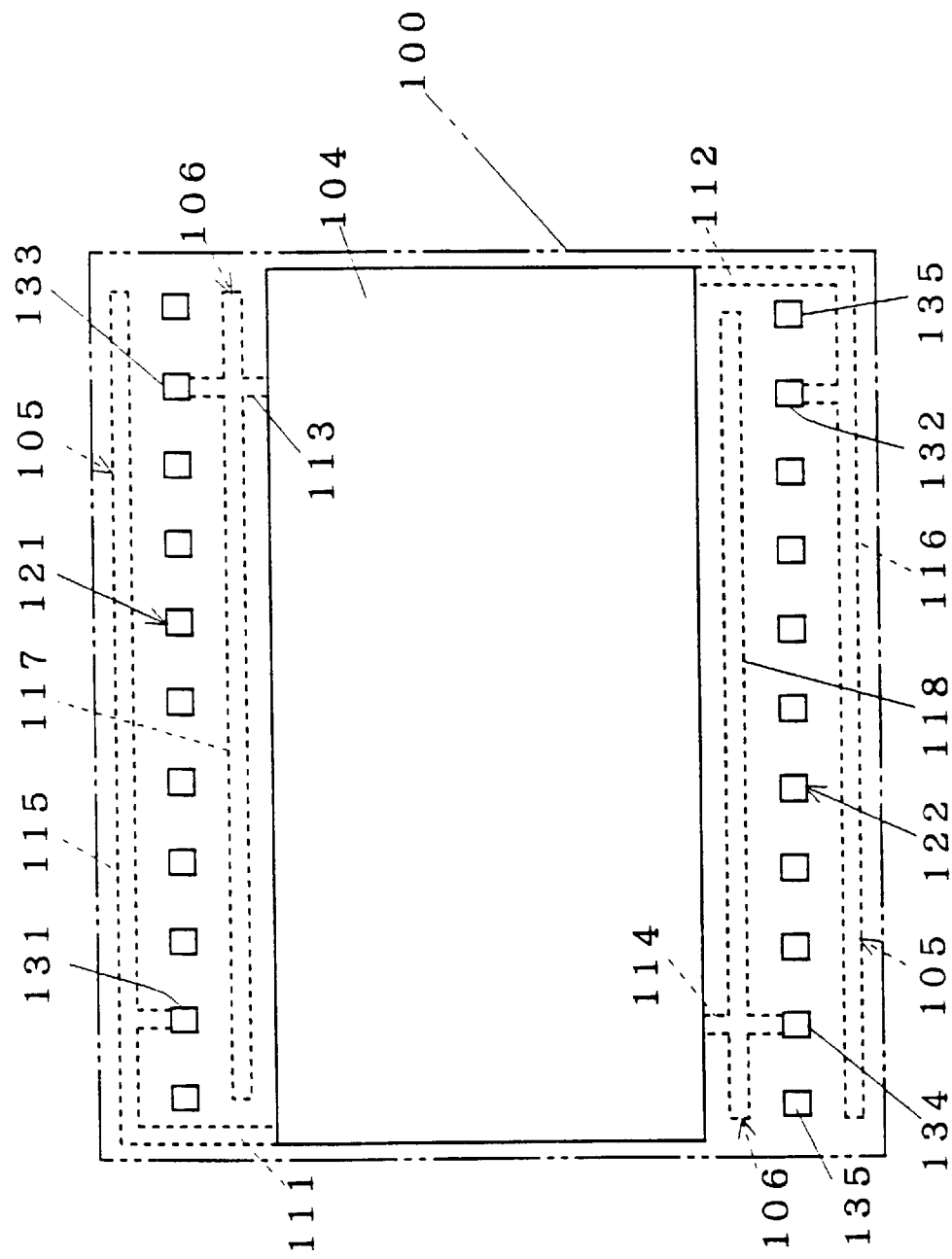
FIG. 9 is a wiring layout diagram showing a periphery of an internal circuit of a semiconductor device according to a modification of the present invention.
Figure 10:
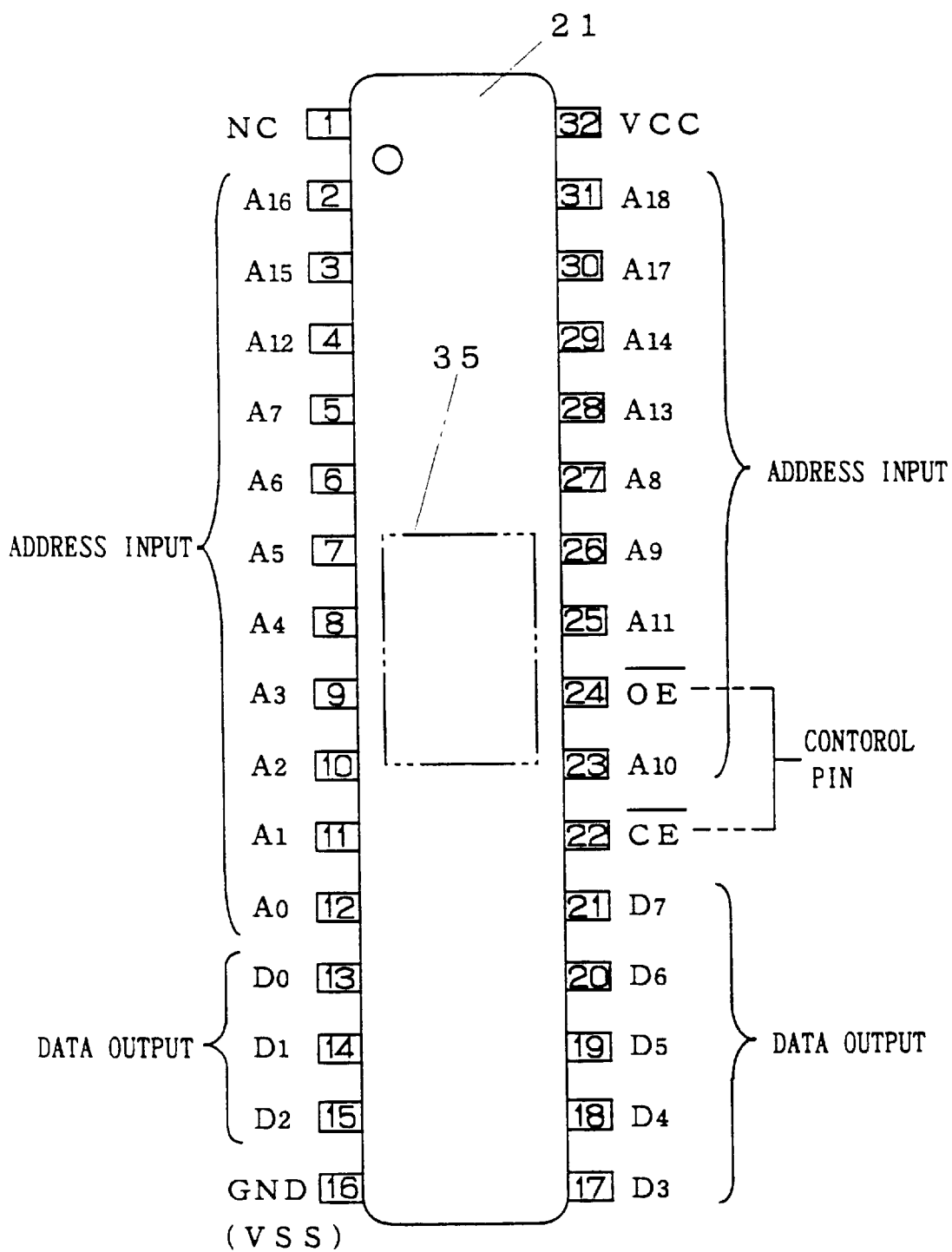
FIG. 10 is a plan view showing a conventional semiconductor device.
Figure 11:
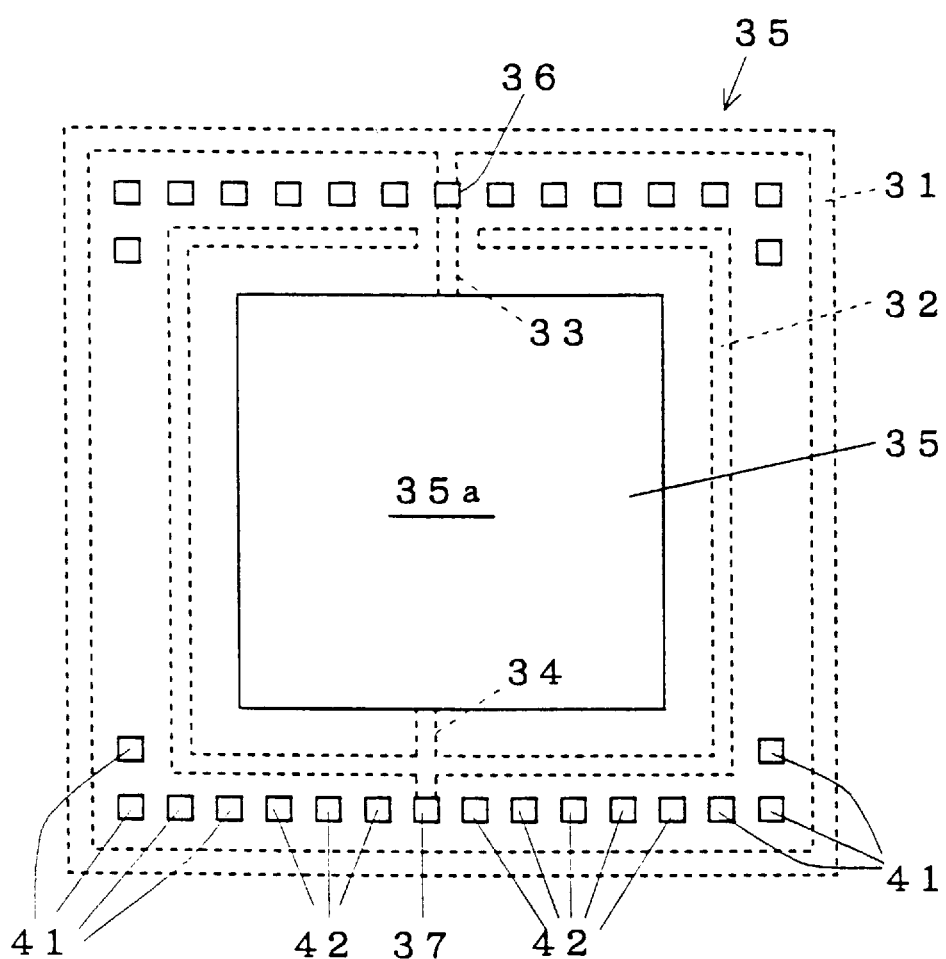
FIG. 11 is a wiring layout diagram showing a periphery of an internal circuit of the conventional semiconductor device.
Figure 12:
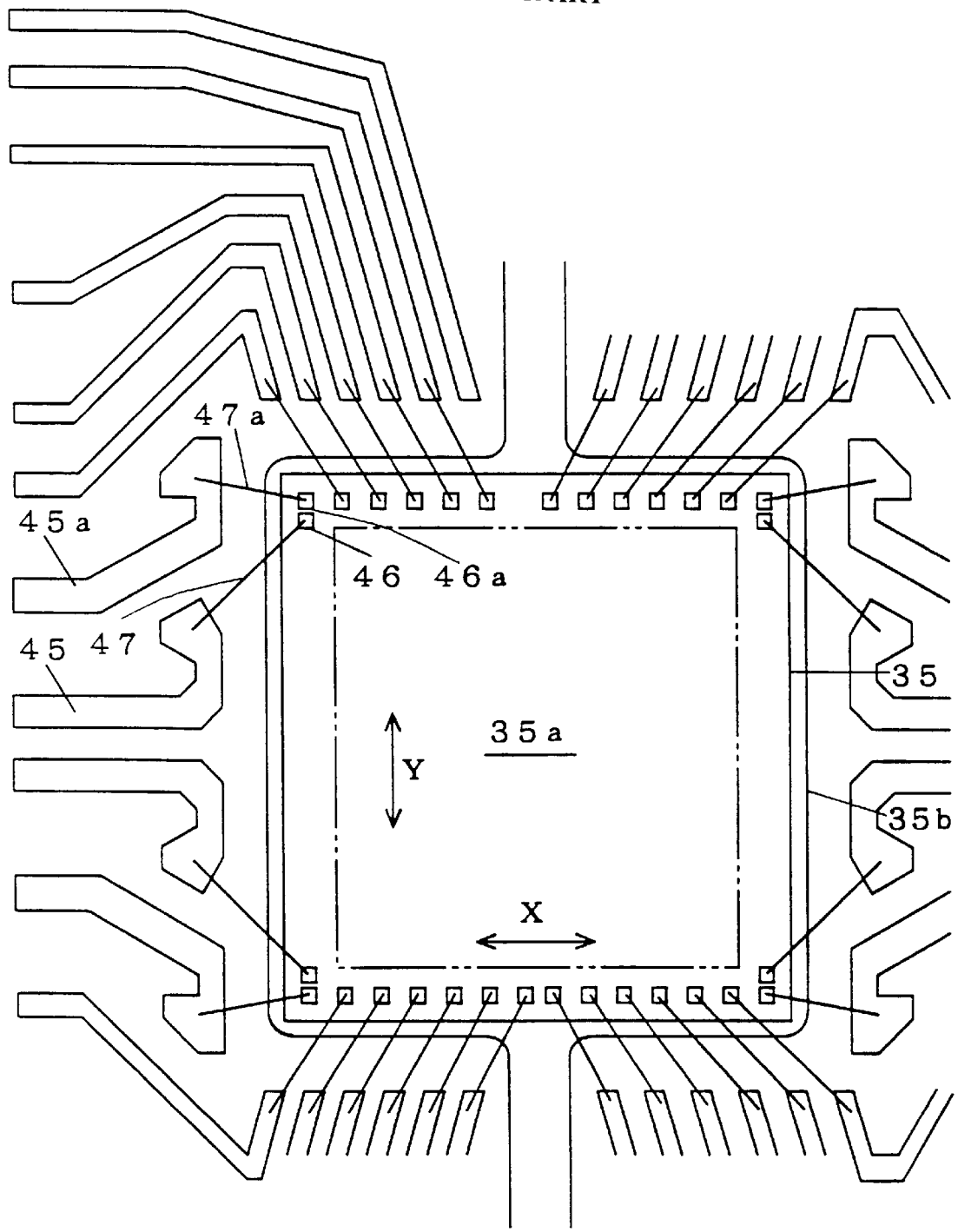
FIG. 12 is a plan view showing the internal circuit and lead frames of the conventional semiconductor device.

(2) As to the first embodiment, the structure shown in FIG. 1 may be replaced by that shown in FIG. 9.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a chip and a package for storing the chip; and a plurality of external connection pins being provided on two opposite edges of said package, said external connection pins including:

power supply pins being formed on said two opposite edges of said package for supplying power to said chip, and ground pins being formed on said two opposite edges of said package for connecting said chip to ground, power supply pads for connection to said power supply pins and ground connection pads for connection to said ground pins being provided on two opposite edges of said chip, respectively; and wherein said chip is provided at least one side thereof with:

a first pad being employed for inputting a prescribed signal in said chip, and a second pad being employed for outputting at least a signal from said chip, one of said power supply pads and one of said ground connection pads being arranged on said at least one side of said chip, with said power supply pad and said ground connection pad being separated from each other at a prescribed distance, only of said second and first pads being arranged between said power supply pad and said ground connection pad, and only the other one of said second and first pads being arranged on an end portion separated from said one pad by one of said power supply pad and said ground connection pad.

2. A semiconductor device comprising:

a chip and a package for storing the chip; and a plurality of external connection pins, including power supply and ground pins, being provided on two opposite edges of said package, said chip including:

an internal circuit having at least one power supply terminal and at least one ground connection terminal on two opposite edges, respectively, a first pad portion for connecting said internal circuit with said power supply pins, and a second pad portion for connecting said internal circuit with said ground pins, said first pad portion comprising:

power supply pads being formed on said two opposite edges of said chip to be wired between said power supply terminals of said internal circuit and said power supply pins, and pad power supply wires being arranged in parallel with each other in the vicinity of said two opposite edges of said internal circuit to be connected to said power supply pads, respectively, said second pad portion comprising:

ground connection pads being formed on said two opposite edges of said chip to be wired between said ground connection terminals of said internal circuit and said ground pins, and pad ground wires being arranged in parallel with each other in the vicinity of said two opposite edges of said internal circuit to be connected to said ground connection pads, respectively;

wherein said chip is provided at least one side thereof with:

a first pad being employed for inputting a prescribed signal in said chip, and a second pad being employed for outputting at least a signal from said chip, one of said power supply pads and one of said ground connection pads being arranged on said at least one side of said chip, with said power supply pad and said ground connection pad being separated from each other at a prescribed distance, only one of said second and first pads being arranged between said power supply pad and said ground connection pad, and only the other one of said second and first pads being arranged on an end portion separated from said one pad by one of said power supply pad and said ground connection pad.

* * * * *